US006645806B2

(12) United States Patent
Roberts

(10) Patent No.: US 6,645,806 B2
(45) Date of Patent: Nov. 11, 2003

(54) METHODS OF FORMING DRAMS, METHODS OF FORMING ACCESS TRANSISTORS FOR DRAM DEVICES, AND METHODS OF FORMING TRANSISTOR SOURCE/DRAIN REGIONS

(75) Inventor: Martin Ceredig Roberts, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/941,375

(22) Filed: Aug. 28, 2001

(65) Prior Publication Data

US 2003/0032229 A1 Feb. 13, 2003

Related U.S. Application Data

(60) Provisional application No. 60/310,938, filed on Aug. 7, 2001.

(51) Int. Cl.$^7$ .......................................... H01L 21/8242
(52) U.S. Cl. ........................ 438/241; 438/301; 438/302; 438/305
(58) Field of Search .............................. 438/174, 194, 438/199, 217, 231, 238, 241, 301, 302, 305, 306; 257/335, 336, 337, 338, 369, 408

(56) References Cited

U.S. PATENT DOCUMENTS

| 5,407,852 A | * | 4/1995 | Ghio et al. ............... 438/130 |
| 5,482,878 A | * | 1/1996 | Burger et al. ............ 438/217 |
| 5,661,048 A | * | 8/1997 | Davies et al. ............ 438/217 |
| 6,127,231 A | * | 10/2000 | Mori ...................... 438/275 |

* cited by examiner

Primary Examiner—Long Pham
Assistant Examiner—Hoai Pham
(74) Attorney, Agent, or Firm—Wells St. John P.S.

(57) ABSTRACT

The invention includes a DRAM device. The device has an access transistor construction, and the access transistor construction has a pair of source/drain regions. A halo region is associated with one of the source/drain regions of the access transistor construction and no comparable halo region is associated with the other of the source/drain regions of the access transistor construction. The invention also encompasses methods of forming DRAM devices.

31 Claims, 5 Drawing Sheets

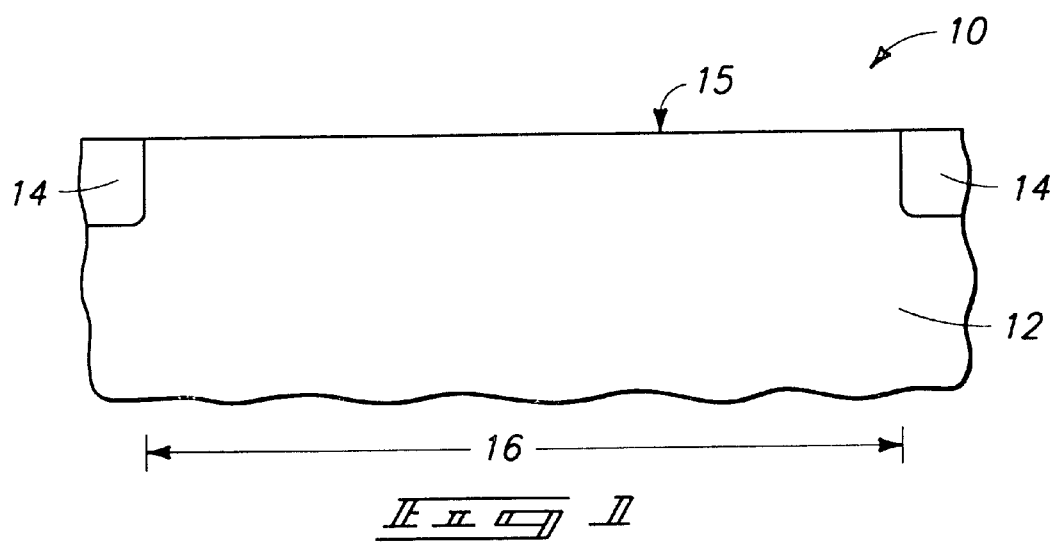
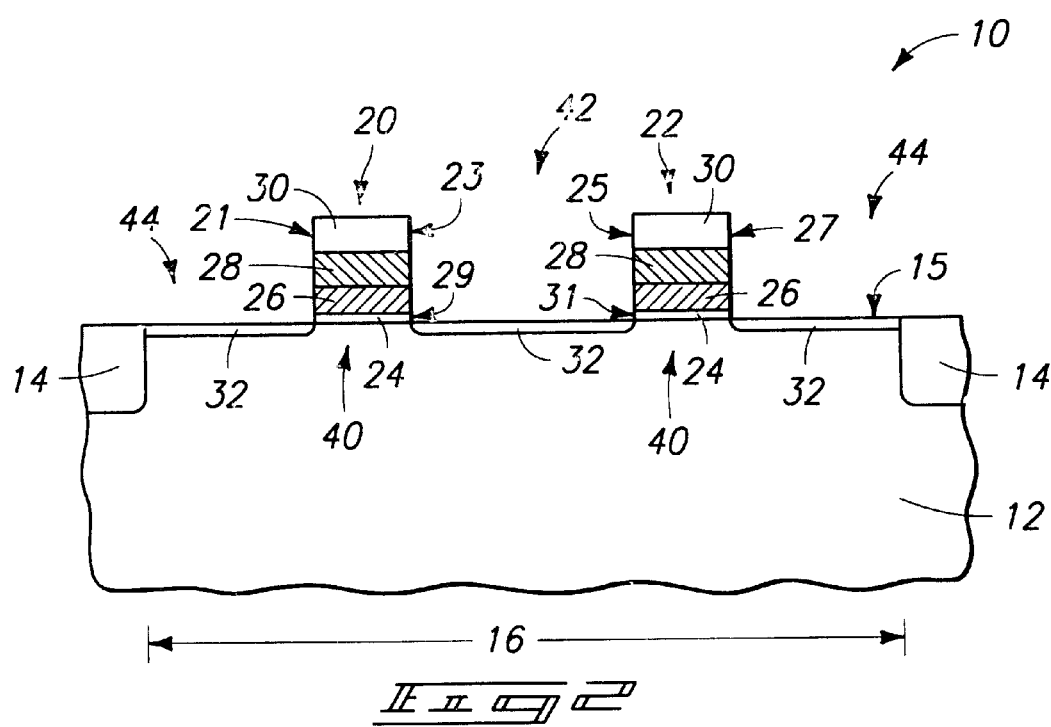

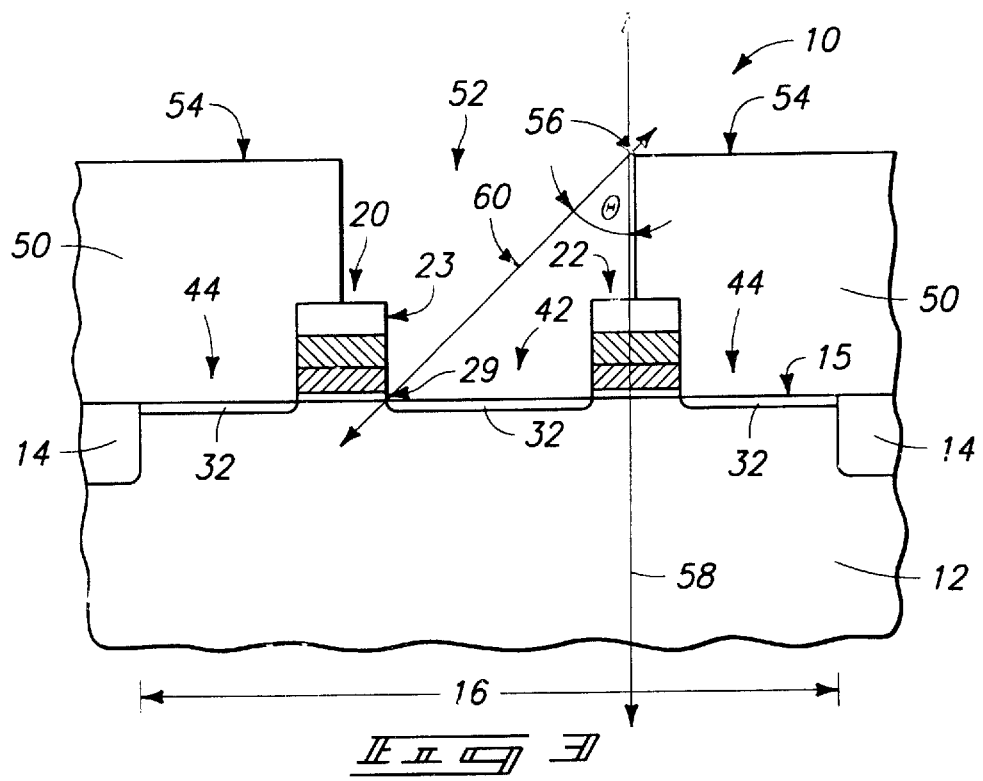
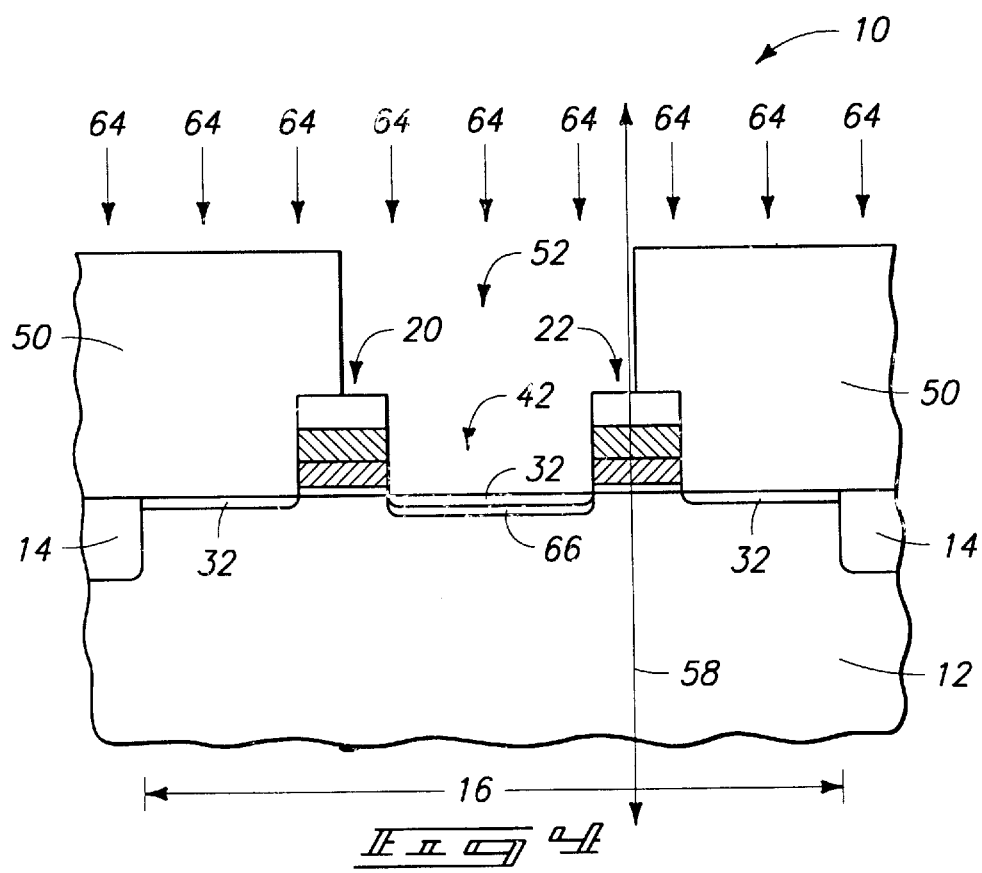

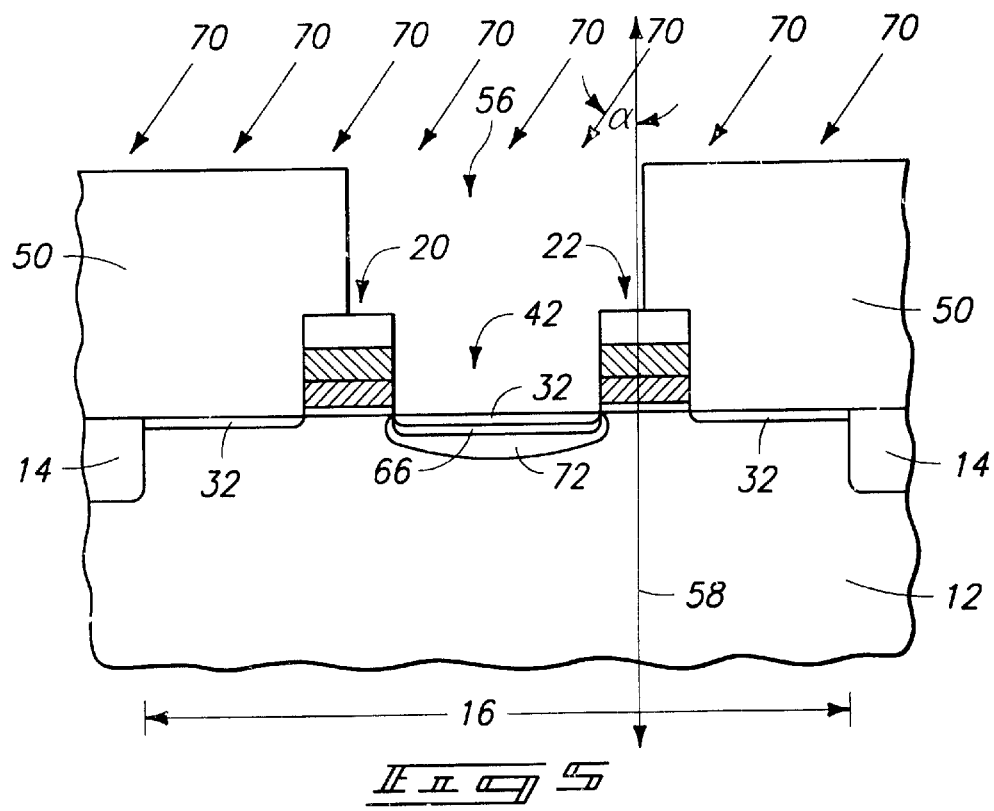
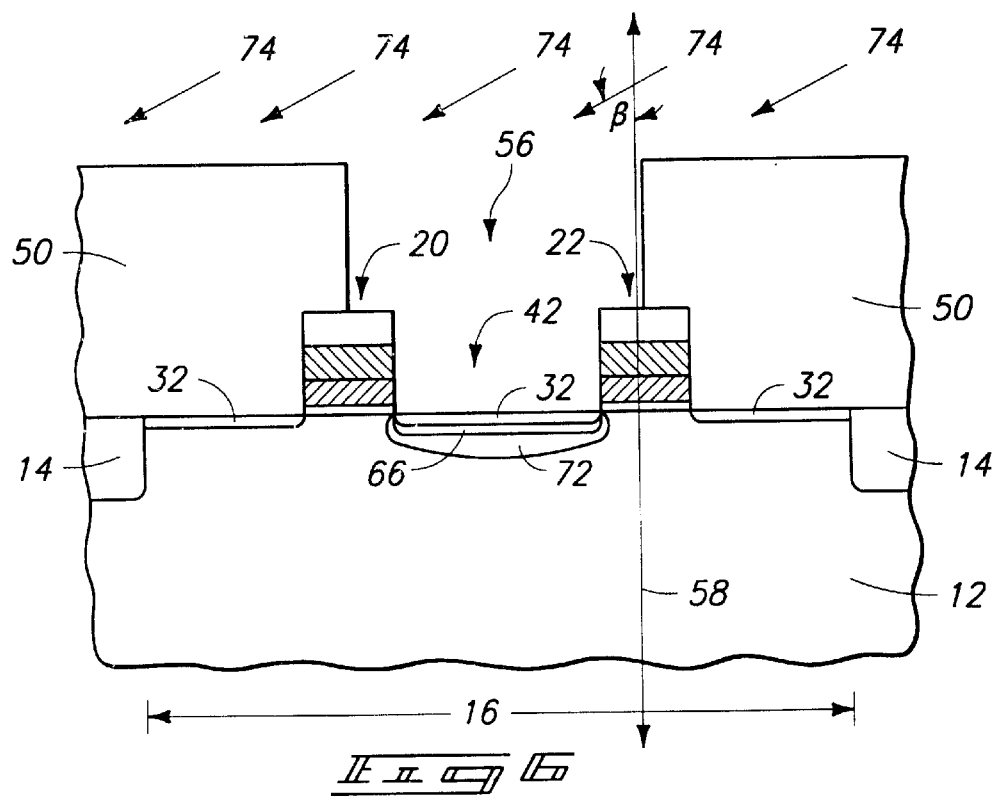

US 6,645,806 B2

METHODS OF FORMING DRAMS, METHODS OF FORMING ACCESS TRANSISTORS FOR DRAM DEVICES, AND METHODS OF FORMING TRANSISTOR SOURCE/DRAIN REGIONS

RELATED PATENT DATA

This patent application claims priority to U.S. Provisional Application Ser. No. 60/310,938; which was filed on Aug. 7, 2001.

TECHNICAL FIELD

The invention pertains to DRAM devices, and to methods of forming DRAM devices. In particular aspects, the invention pertains to methods of forming access transistor constructions for DRAM devices.

BACKGROUND OF THE INVENTION

Dynamic random access memory (DRAM) is commonly utilized for computer memory. DRAM is incorporated into integrated circuit chips. Such chips frequently comprise a memory array of DRAM devices, and further comprise logic devices provided around a periphery of the memory array. The logic devices can be referred to as peripheral devices.

There is a continuing goal to reduce the size of memory devices and peripheral devices to conserve valuable semiconductor substrate real estate. Another continuing goal is to utilize common fabrication steps during formation of peripheral and memory device structures to reduce the processing time utilized in forming a complete integrated circuit construction.

It would be desirable to develop methods for DRAM fabrication which allow utilization of relatively small memory device structures, and it would be further desirable if such methods could utilize fabrication steps in common with the fabrication of peripheral device circuitry.

SUMMARY OF THE INVENTION

In one aspect, the invention encompasses a method of forming a DRAM device. The device includes an access transistor construction having a pair of source/drain regions. A halo region is associated with one of the source/drain regions of the access transistor construction and no comparable halo region is associated with the other of the source/drain regions of the access transistor construction.

In another aspect, the invention encompasses a method of forming a DRAM device. A substrate is provided, and the substrate has an active area defined therein. A pair of transistor gate structures are formed over the active area of the substrate. The transistor gate structures are spaced from one another by a gap, and the active area comprises a first portion covered by the transistor gate structures and a second portion between the transistor gate structures. The active area further comprises a third portion which is neither between the transistor gate structures or covered by the transistor gates structures. A mask is formed over the third portion of the active area while leaving the second portion uncovered. While the mask is over the third portion of the active area, dopant is implanted into the opening in the mask at an angle to reach through the gap and to the substrate. A pair of capacitor structures and a bitline are formed. The bitline is gatedly connected to one of the capacitor structures through one of the transistor gate structures, and gatedly connected to the other of the capacitor structures through the other of the transistor gate structures.

In another aspect, the invention encompasses DRAM constructions.

BRIEF DESCRIPTION OF THE DRAWINGS

Preferred embodiments of the invention are described below with reference to the following accompanying drawings.

FIG. 1 is a diagrammatic, cross-sectional view of a semiconductor wafer fragment shown at a preliminary processing step of a method of the present invention.

FIG. 2 is a view of the FIG. 1 wafer fragment shown at a processing step subsequent to that of FIG. 1.

FIG. 3 is a view of the FIG. 1 wafer fragment shown at a processing step subsequent to that of FIG. 2.

FIG. 4 is a view of the FIG. 1 wafer fragment shown at a processing step subsequent to that of FIG. 3.

FIG. 5 is a view of the FIG. 1 wafer fragment shown at a processing step subsequent to that of FIG. 4.

FIG. 6 is a view of the FIG. 1 wafer fragment shown at a processing step subsequent to that of FIG. 5.

FIG. 9 illustrates a peripheral circuitry portion of the wafer of FIG. 1, and subjected to the processing of FIGS. 4–6.

DETAILED DESCRIPTION OF THE PREFERRED EMBODIMENTS

Figure 7:
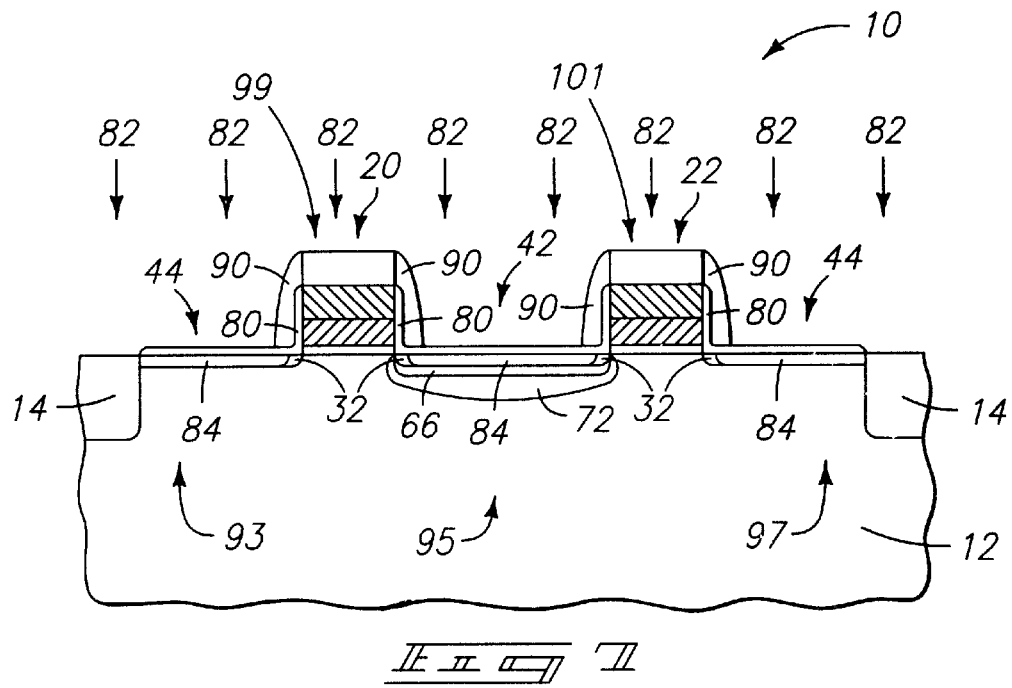
FIG. 7 is a view of the FIG. 1 wafer fragment shown at a processing step subsequent to that of FIG. 6.

A method of the present invention is described with reference to FIGS. 1–9. Referring initially to FIG. 1, a semiconductor wafer fragment 10 is illustrated at a preliminary processing step. Wafer fragment 10 comprises a substrate 12 having an upper surface 15, and isolation regions 14 formed therein. Substrate 12 can comprise, for example, monocrystalline silicon lightly-doped with a background p type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Isolation regions 14 can comprise, for example, shallow trench isolation regions comprising insulative material, such as silicon dioxide. An active region 16 is defined to extend between isolation regions 14. Active region 16 ultimately comprises source/drain regions (described with reference to FIGS. 3–9) gatedly connected through transistor gate constructions (described with reference to FIG. 2).

Referring next to FIG. 2, transistor gate constructions 20 and 22 are shown formed over substrate 12. Transistor gate constructions 20 and 22 can be referred to as a first transistor gate construction and a second transistor gate construction, respectively. Constructions 20 and 22 comprise a gate dielectric layer 24, a silicon layer 26, a metal silicide layer 28, and an insulative cap 30. Gate dielectric layer 24 will typically comprise silicon dioxide, silicon layer 26 will typically comprise conductively doped silicon, silicide layer 28 will typically comprise tungsten silicide or titanium silicide, and insulative cap 30 will typically comprise silicon nitride or silicon dioxide.

It is to be understood that the shown layers of gate constructions 20 and 22 are exemplary layers, and that other layers can be utilized in addition to, or alternatively to, the shown layers. For instance, a metal layer can be incorporated between silicide layer 28 and insulative cap 30.

Gate constructions 20 and 22 separate active area 16 into three regions. Specifically, gates constructions 20 and 22 define a first region 40 of active area 16 as the region beneath constructions 20 and 22; define a second region 42 of the active area 16 between gate constructions 20 and 22; and define a third region 44, which is the remaining portion of active region 16 not encompassed by either the first or second regions. In the discussion that follows, regions 44 can be referred to as outer source/drain region locations, and region 42 can be referred to as an inner source/drain region location.

Transistor gate constructions 20 and 22 can be considered to be transistor gate structures which are separated from one another by a gap corresponding to the region 42 of active area 16 between the gate structures 20 and 22. Gate structure 20 comprises a first sidewall 21 and a second sidewall 23 in opposing relation to first sidewall 21; and structure 22 comprises a first sidewall 25 and a second sidewall 27 in opposing relation to sidewall 25. Sidewalls 21 and 27 can be referred to as outer sidewalls of the gate structures, and sidewalls 23 and 25 can be referred to as inner sidewalls of the gate structures. Further, the gate structures 20 and 22 can be considered to comprise inner corners 29 and 31, respectively, where the inner sidewalls join to substrate 12.

Lightly doped diffusion regions (LDD regions) 32 are shown formed within substrate 12 and proximate structures 20 and 22. In particular embodiments, regions 32 comprise n-type dopant provided to a concentration of less than or equal to $10^{18}$ atoms/cm$^3$ within substrate 12. It is noted that the diffusion regions 32 can be omitted in particular embodiments of the present invention.

Referring to FIG. 3, a mask 50 is formed over substrate 12. Mask 50 can comprise, for example, photoresist. Mask 50 covers third portion 44 of active region 16, but does not cover the second portion 42 of active region 16. 1In other words, mask 50 does not cover the gap between transistor gate structures 20 and 22. Mask 50 has an opening 52 formed therein and extending over the gap between transistor gate structures 20 and 22. Mask 50 further comprises a top surface 54, and an edge 56 of the top surface which defines an upper periphery of opening 52.

A vertical projection 58 is shown extending upwardly through substrate 12, and approximately perpendicular to upper surface 15 of the substrate. A second projection 60 is defined to extend from top edge 56 to inner corner 29. Second projection 60 forms an angle "θ" with vertical projection 58. Angle "θ" can be referred to as a threshold angle, as angle θ defines a threshold dopant angle which determines if dopant can be implanted through opening 52 and to substrate 12. Specifically, if dopant is implanted at an angle greater than "θ", the dopant will not reach substrate 12. Instead, the dopant will impact sidewalls of opening 52 and portions of transistor gate structure 20. Alternatively, if dopant is implanted at an angle less than the threshold angle, it will impact substrate 12 within the gap defined by region 42.

Referring to FIG. 4, a first dopant 64 is implanted into opening 52 at a first angle of approximately 0° relative to vertical projection 58. Accordingly, dopant 64 is implanted at an angle less than the threshold angle "θ", and impacts substrate 12 within region 42 to form a implant region 66. Dopant 64 can comprise, for example, n type dopant (such as arsenic) and can be provided to a concentration of from about $10^{18}$ atoms/cm$^3$ to about $10^{19}$ atoms/cm$^3$.

Referring next to FIG. 5, a second dopant 70 is implanted into opening 56 at an angle "α" relative to vertical projection 58. Angle "α" is less than threshold angle "θ" and accordingly dopant 70 impacts substrate 12 within region 42 to form a implant region 72. In the shown embodiment, implant region 72 is deeper than region 66. It is to be understood, however, that the invention encompasses other embodiments wherein region 72 is implanted to be shallower than region 66. In particular embodiments, dopant 70 comprises a p type dopant (such as boron), and is implanted at an angle "α" greater than about 0° and less than about 20°. Further, the p type dopant is implanted at an energy of at least about 25 KeV, and a dose of at least about $10^{12}$ atoms/cm$^2$.

Referring next to FIG. 6, a third dopant 74 is implanted at an angle "β" relative to vertical projection 58, with angle "β" being greater than the threshold angle θ. Accordingly, third dopant 74 does not reach substrate 12. Third dopant 74 can comprise, for example, p type dopant, and can be implanted at an angle "β" greater than or equal to 25°.

The dopants 64, 70 and 74 can be implanted into a peripheral region (described with reference to FIG. 9) associated with substrate 12 simultaneously with the implant of the dopants into the shown DRAM region. Dopant 74 can comprise an energy of at least about 50 KeV, and a dose of about 6×1011 atoms/cm$^2$. In the shown embodiment, angle "" is chosen to preclude impact of dopant 74 on substrate 12 within region 42. However, dopant 74 can be at an appropriate angle for implanting into regions of the substrate associated with various peripheral circuitry devices. A common mask can be utilized during the entire doping sequence for implanting of dopants 64, 70 and 74.

Referring to FIG. 7, mask 50 (FIG. 6) is removed and a thin insulative layer 80 is provided over exposed regions of substrate 12, as well as along sidewalls of transistor gate structures 20 and 22. Layer 80 can comprise, for example, silicon dioxide formed by exposing substrate 12 and transistor gate structures 20 and 22 to oxidizing conditions. It is noted that the invention encompasses other embodiments (not shown) wherein layer 80 is not formed.

A dopant 82 is implanted into substrate 12, after formation of layer 80, to form an LDD implant 84. LDD implant 84 overlaps with the previous LDD implant 32, and can comprise, for example, n-type dopant. It is to be understood that the invention encompasses embodiments wherein implant 82 is eliminated, as well as embodiments in which one of the implant regions 32 (FIG. 2) or 84 is eliminated, while the other is utilized. Accordingly, the implanting of dopants 64, 70 and 74 can occur before formation of LDD regions, after formation of LDD regions, or between a first LDD implant and a second LDD implant. Additionally, it is noted that the implanting of dopants 64, 70 and 74 can occur in any order relative to one another, such as, for example, with the implanting of the p-type dopants 70 and 74 occurring before the implanting of the n-type dopant 64.

After formation of layer 80, sidewall spacers 90 are formed along the sidewalls of transistor gate structures 20 and 22. Sidewall spacers 90 can comprise, for example, silicon dioxide or silicon nitride, and can be formed by anisotropically etching an appropriate insulative material layer.

In the processing step of FIG. 7, inner source/drain region location 42 comprises a source/drain region 95, and outer source/drain region locations 44 comprise source/drain regions 93 and 97. Source/drain regions 93 and 95, together with gate structure 20, define a first transistor construction 99; and source/drain regions 95 and 97, together with gate structure 22, define a second transistor construction 101. In other words, source/drain region 95 is gatedly connected to source/drain regions 93 and 97 through transistor gates 20 and 22, respectively. Source/drain region 95 can be considered to be a shared source/drain region, in that it is shared by first transistor construction 99 and second transistor construction 101.

Shared source/drain region 95 is different in dopant constituency than the outer source/drain regions 93 and 97. Specifically, source/drain region 95 comprises halo regions 72, and outer source/drain regions 93 and 97 do not comprise halo regions.

Although the shown invention comprises formation of NMOS transistor devices (i.e., devices in which the source/drain regions primarily comprise n-type regions, with a source/drain region which "primarily comprises n-type regions" being understood as a source/drain region which behaves generally as being n-type in character during operation of a device comprising the source/drain region), it is to be understood that the invention can also be utilized for formation of PMOS transistor devices. If the invention is utilized for formation of PMOS devices, the conductivity type of the regions 32, 84, 72 and 66 can be reversed relative to that described herein. In other words, conductivity regions 32, 84 and 66 are described as being n-type regions, but in a PMOS device such regions would correspond to p-type regions. Further, region 72 is described as being a p-type halo region in the shown NMOS construction, but in a PMOS construction would correspond to an n-type region.

Figure 8:
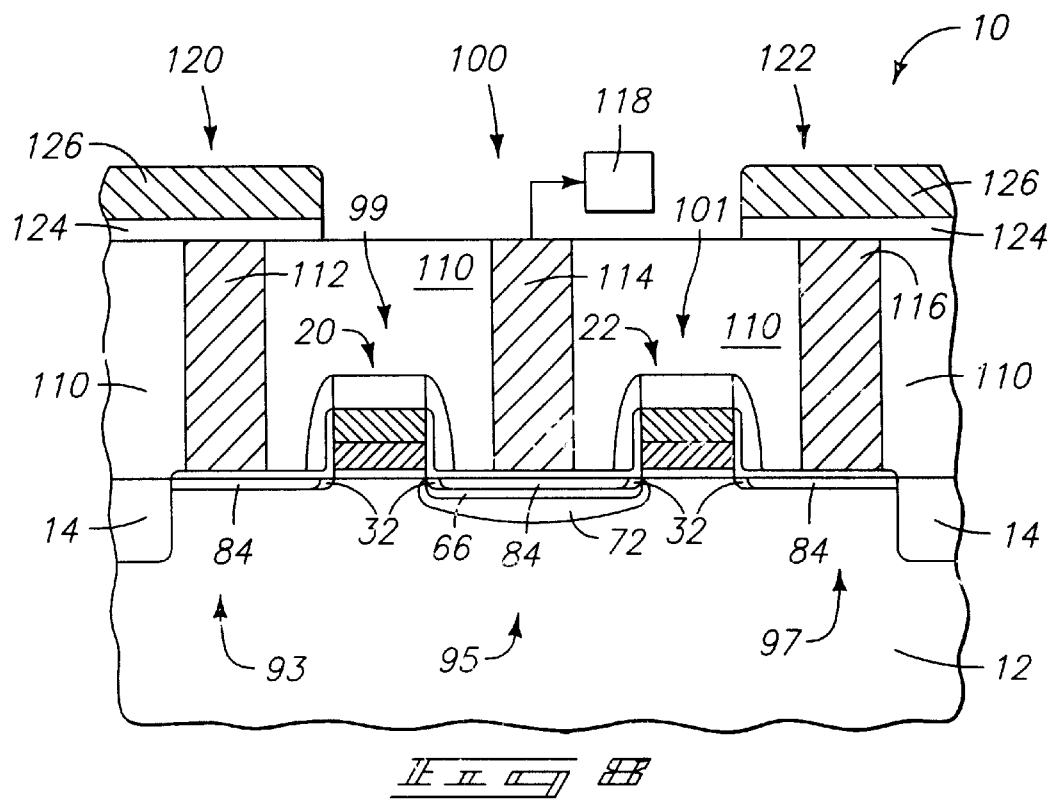
FIG. 8 is a view of the FIG. 1 wafer fragment shown at a processing step subsequent to that of FIG. 7.

Referring to FIG. 8, a DRAM construction 100 is formed utilizing the transistor devices of FIG. 7. Specifically, an insulative material 110 is formed over substrate 12, and conductive interconnects 112, 114 and 116 extend through the insulative material 110 to the source/drain regions 93, 95, and 97. Insulative material 110 can comprise, for example, borophosphosilicate glass (BPSG), and conductive interconnects 112 can comprise, for example, one or more of conductively-doped silicon, metal silicide, and elemental metal.

Conductive interconnect 114 is electrically connected with a bitline 118, which results in an electrical connection between shared source/drain region 95 and the bitline 118. Electrical connections 112 and 116 are incorporated into capacitor constructions 120 and 122, respectively. Specifically, a dielectric material 124 is formed over electrical connections 112 and 116, and a capacitor plate 126 is subsequently formed over the dielectric material 124. Accordingly, conductive interconnects 112 and 116 are incorporated into capacitor constructions 120 and 122 as storage nodes. Dielectric material 124 can comprise, for example, one or more of silicon dioxide, silicon nitride, or so-called high K dielectric materials, such as tantalum pentoxide. Capacitor plates 126 can comprise, for example, one or more of conductively-doped silicon, metal, or metal silicide.

Transistor constructions 99 and 101 define access transistors for the DRAM construction 100, in that transistor constructions 99 and 101 are utilized to provide access between bitline 118 and the capacitor constructions 120 and 122.

The processing described with reference to FIGS. 7 and 8 would typically occur while a mask is provided over peripheral circuitry, so that the processing of FIGS. 7 and 8 occurs only in a DRAM area of an integrated circuit structure. However, it should also be understood that various steps of the processing of FIGS. 7 and 8 will preferably be conducted simultaneously with steps utilized in the formation of peripheral circuit elements if a particular fabrication sequence is amenable to simultaneous formation of peripheral device components and DRAM memory components.

The implants of FIGS. 4 and 5 can provide particular advantages to DRAM structures formed in accordance with the present invention. The n-type implant 64 (FIG. 4) reduces n-resistance of shared source/drain region 95 for improved drive current and improved hot electron reliability. The p-type angled implant 70 (FIG. 5) increases the threshold voltage of the access devices 99 and 101. Utilization of the p-type implant only relative to source/drain region 95 (and not relative to source/drain regions 93 and 97) allows the threshold voltage to be increased for the access transistors, while providing the halo implanting only on the digit side of the devices and thereby not disrupting careful control of graded junctions on the storage sides of the devices. It can be desired to maintain careful control of graded junction regions on the storage node side of an access transistor in order to minimize junction leakage and maintain adequate data retention for the DRAM memory.

Figure 9:
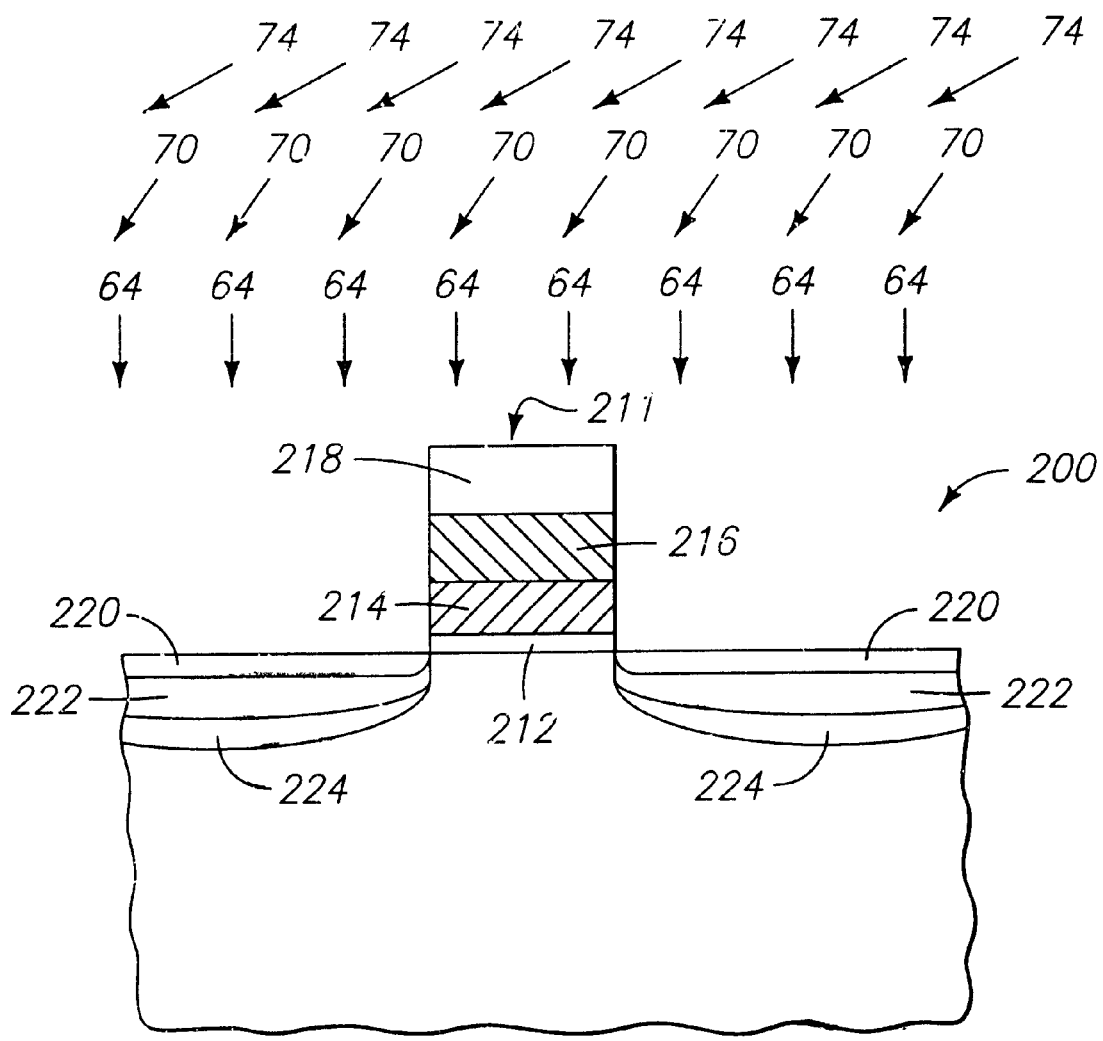
FIG. 9 is a view of the wafer of FIG. 1, illustrating a different fragment that that of FIG. 1. Specifically.

As described above, the processing of FIGS. 4–6 can be utilized to simultaneously form implanted regions within logic circuitry peripheral to a DRAM memory array. If it is assumed that the wafer fragment 10 of FIGS. 4–6 is associated with a DRAM memory array region, than the wafer comprising fragment 10 can comprise another fragment associated with logic circuitry peripheral to the memory array region. FIG. 9 illustrates a fragment 200 of the wafer. Fragment 200 is peripheral to the fragment 10 of FIGS. 1–8, and is associated with logic circuitry. A transistor gate structure 211 is shown formed over substrate 12. Gate structure 211 comprises a gate oxide 212, a silicon layer 214, a silicide layer 216 and an insulative cap 218. Layers 212, 214, 216 and 218 can comprise the same materials as described previously for layer 24, 26, 28 and 30, respectively. Dopants 64, 70 and 74 are shown being implanted into substrate 12 proximate structure 211 to form implant regions 220, 222 and 224, respectively. The implanting of dopants 64, 70 and 74 into fragment 200 preferably occurs simultaneously with the implanting of dopants 64, 70 and 74 described previously with reference to FIGS. 4, 5 and 6. In other words, the implanting of each of dopants 64, 70 and 74 is preferably blanket implanting in the sense that the dopants are simultaneously implanted over memory array regions and logic regions peripheral to the memory array regions.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming an access transistor construction for a DRAM device, comprising:
   providing a substrate;
   forming an access transistor gate structure over the substrate;

forming a pair of source/drain regions within the substrate and gatedly connected to one another through the access transistor gate structure;

forming a halo region within one of the source/drain regions and not forming any halo region within the other of the source/drain regions; and wherein:
the DRAM device is within a memory array;
logic circuitry is supported by the substrate in locations peripheral to the memory array;
the source/drain regions primarily comprise n-type doped regions;
the halo region is a p-type doped region; and
the halo region is formed with an implant of p-type dopant, and such implant also provides the p-type dopant within the logic circuitry.

2. The method of claim 1 wherein:
the halo region is formed before at least one of the n-type doped regions is formed.

3. A method of forming an access transistor construction for a DRAM device, comprising:
providing a substrate;
forming an access transistor gate structure over the substrate;
forming a pair of source/drain regions within the substrate and gatedly connected to one another through the access transistor gate structure;
forming a halo region within one of the source/drain regions and not forming any halo region within the other of the source/drain regions; and
wherein:
the source/drain regions comprise lightly n-type doped regions;
the halo region is a p-type doped region; and
the halo region is formed before the lightly n-type doped regions are formed.

4. A method of forming an access transistor construction for a DRAM device, comprising:
providing a substrate;
forming an access transistor gate structure over the substrate;
forming a pair of source/drain regions within the substrate and gatedly connected to one another through the access transistor gate structure;
forming a halo region within one of the source/drain regions and not forming any halo region within the other of the source/drain regions; and
wherein:
the source/drain regions comprise lightly n-type doped regions;
by the halo region is a p-type doped region; and
the lightly n-type doped regions are formed with a first implant and a second implant, the first implant occurring before forming the halo region and the second implant occurring after forming the halo region.

5. A method of forming a DRAM device, comprising:
providing a substrate having an active area defined therein;
providing a pair of transistor gate structures over the active area of the substrate, the transistor gate structures being spaced from one another by a gap; the active area comprising a first portion covered by the transistor gate structures, a second portion between the transistor gate structures, and a third portion which is neither between the transistor gate structures or covered by the transistor gate structures;

forming a mask over the third portion of the substrate while leaving the second portion uncovered;

while the mask is over the third portion of the substrate, first implanting a first dopant into the uncovered second portion, the first implanting comprising implanting the first dopant at a first angle to reach through the gap and to the substrate;

while the mask is over the third portion of the substrate, second implanting a second dopant into the uncovered second portion, the second implanting comprising implanting the second dopant at a second angle to reach through the gap and to the substrate; one of the first and second dopants being an n-type dopant and the other being a p-type dopant; and forming a pair of capacitor structures and a bitline; the bitline being gatedly connected to one of the capacitor structures through one of the transistor gate structures, and being gatedly connected to the other of the capacitor structures through the other of the transistor gate structures.

6. The method of claim 5 wherein the first and second angles are different from one another.

7. The method of claim 5 wherein the n-type dopant is implanted at a smaller angle than the p-type dopant.

8. The method of claim 5 wherein the n-type dopant is implanted at an angle of about 0° and the p-type dopant is implanted at an angle of greater than about 0° and less than or equal to about 20°.

9. The method of claim 5 wherein the n-type dopant is implanted at an angle of about 0° and the p-type dopant is implanted at an angle of greater than about 0° and less than or equal to about 20°; the n-type dopant being implanted to a concentration of from about $10^{18}$ atoms/cm$^3$ to about $10^{19}$ atoms/cm$^3$ and the p-type dopant being implanted at an energy of at least about 25 KeV and a dose of at least about $10^{12}$ atoms/cm$^2$.

10. The method of claim 5 wherein:
the DRAM device is within a memory array;
logic circuitry is supported by the substrate in locations peripheral to the memory array; and
the first and second implantings also provide the first and second dopants within the logic circuitry.

11. A method of forming a DRAM device, comprising:
providing a substrate having an active area defined therein;
providing a pair of transistor gate structures over the active area of the substrate, the transistor gate structures being spaced from one another by a gap; the active area comprising a first portion covered by the transistor gate structures, a second portion between the transistor gate structures, and a third portion which is neither between the transistor gate structures or covered by the transistor gate structures;

forming a mask over the third portion of the substrate while leaving the second portion uncovered;

while the mask is over the third portion of the substrate, first implanting a first dopant into the uncovered second portion, the first implanting comprising implanting the first dopant at a first angle to reach through the gap and to the substrate;

while the mask is over the third portion of the substrate, second implanting a second dopant into the uncovered second portion, the second implanting comprising implanting the second dopant at a second angle to reach through the gap and to the substrate;

while the mask is over the third portion of the substrate, third implanting a third dopant, the third implanting comprising implanting the third dopant at a third angle to not reach through the gap and to the substrate; one of the first and second dopants being an n-type dopant and the other being a p-type dopant; the third dopant being p-type dopant; and forming a pair of capacitor structures and a bitline; the bitline being gatedly connected to one of the capacitor structures through one of the transistor gate structures, and being gatedly connected to the other of the capacitor structures through the other of the transistor gate structures.

12. The method of claim 11 wherein the n-type dopant of the first and second dopants is implanted at a smaller angle than the p-type dopant of the first and second dopants.

13. The method of claim 11 wherein the n-type dopant of the first and second dopants is implanted at an angle of about 0°, the p-type dopant of the first and second dopants is implanted at an angle of greater than about 0° and less than or equal to about 20°, and the p-type dopant corresponding to the third dopant is implanted an angle greater than 25°.

14. The method of claim 11 wherein the n-type dopant of the first and second dopants is implanted at an angle of about 0° and the p-type dopant of the first and second dopants is implanted at an angle of greater than about 0° and less than or equal to about 20°; the n-type dopant of the first and second dopants being implanted to a concentration of from about $10^{18}$ atoms/cm$^3$ to about $10^{19}$ atoms/cm$^3$ and the p-type dopant of the first and second dopants being implanted at an energy of at least about 25 KeV and a dose of at least about $10^{12}$ atoms/cm$^2$.

15. The method of claim 11 wherein:
the DRAM device is within a memory array;
logic circuitry is supported by the substrate in locations peripheral to the memory array; and
the first, second and third implantings also provide the first, second and third dopants within the logic circuitry.

16. A method of forming a DRAM device, comprising:
providing a substrate having a pair of transistor gate structures thereover, the transistor gate structures being spaced from one another by a gap; the transistor gate structures having inner sidewalls proximate the gap and inner corners where the inner sidewalls join the substrate; the transistor gate structures having outer sidewalls in opposing relation to the inner sidewalls, an inner source/drain region location being defined between the inner sidewalls, and a pair of outer source/drain region locations being defined outwardly proximate the outer sidewalls;
forming a mask over a portion of the substrate to cover the portion while leaving another portion of the substrate uncovered, the uncovered portion including the gap between the transistor gate structures and the covered portion including the outer source/drain region locations, the mask defining an opening over the gap; the mask having a top edge which defines an upper periphery of the opening; a threshold angle being defined between a vertical projection and another projection extending from the top edge to an inner corner of one of the transistor gate structures;
while the mask is over the portion of the substrate, first implanting dopant into the opening in the mask, the first implanting comprising implanting a first dopant at an angle less than the threshold angle to reach through the gap and to the substrate;
forming outer source/drain regions in the outer source/drain region locations, and forming a shared source/drain region in the inner source/drain region location;
forming a bitline in electrical contact with the shared source/drain region; and
forming capacitor structures in electrical contact with the outer source/drain regions.

17. The method of claim 16 wherein the first dopant is a p-type dopant, and wherein the source/drain regions primarily comprise n-type regions.

18. The method of claim 16 wherein the source/drain regions primarily comprise n-type regions; and further comprising:
while the mask is over the portion of the substrate, second implanting dopant into the opening in the mask, the second implanting comprising implanting a second dopant at an angle less than the threshold angle to reach through the gap and to the substrate; and
one of the first and second dopants being an n-type dopant and the other being a p-type dopant.

19. The method of claim 18 wherein the n-type dopant is implanted at a smaller angle than the p-type dopant.

20. The method of claim 18 wherein the n-type dopant is implanted at an angle of about 0° and the p-type dopant is implanted at an angle of greater than about 0° and less than or equal to about 20°.

21. The method of claim 18 wherein the n-type dopant is implanted at an angle of about 0° and the p-type dopant is implanted at an angle of greater than about 0° and less than or equal to about 20°; the n-type dopant being implanted to a concentration of from about $10^{18}$ atoms/cm$^3$ to about $10^{19}$ atoms/cm$^3$ and the p-type dopant being implanted at an energy of at least about 25 KeV and a dose of at least about $10^{12}$ atoms/cm$^2$.

22. The method of claim 16 wherein the source/drain regions primarily comprise n-type regions, and further comprising:
while the mask is over the portion of the substrate, second implanting dopant into the opening in the mask, the second implanting comprising implanting a second dopant at an angle less than the threshold angle to reach through the gap and to the substrate;
while the mask is over the portion of the substrate, third implanting dopant into the opening in the mask, the third implanting comprising implanting a third dopant at an angle greater than the threshold angle; and
one of the first and second dopants being an n-type dopant and the other being a p-type dopant; the third dopant being p-type dopant.

23. The method of claim 22 wherein the first, second and third implantings occur sequentially in the order of the first implanting, the second implanting, and finally the third implanting.

24. The method of claim 22 wherein the n-type dopant of the first and second dopants is implanted at a smaller angle than the p-type dopant of the first and second dopants.

25. The method of claim 22 wherein the n-type dopant of the first and second dopants is implanted at an angle of about 0°, the p-type dopant of the first and second dopants is implanted at an angle of greater than about 0° and less than or equal to about 20°, and the p-type dopant corresponding to the third dopant is implanted an angle greater than 25°.

26. The method of claim 22 wherein the n-type dopant of the first and second dopants is implanted at an angle of about 0° and the p-type dopant of the first and second dopants is implanted at an angle of greater than about 0° and less than or equal to about 20°; the n-type dopant of the first and second dopants being implanted to a concentration of from about $10^{18}$ atoms/cm$^3$ to about $10^{19}$ atoms/cm$^3$ and the p-type dopant of the first and second dopants being implanted at an energy of at least about 25 KeV and a dose of at least about $10^{12}$ atoms/cm$^2$.

27. The method of claim 16 wherein the first dopant is a n-type dopant, and wherein the source/drain regions are n-type regions.

28. A method of forming transistor source/drain regions, comprising:

providing a semiconductive material substrate and defining at least two transistor source/drain regions within the substrate, one of the at least two source/drain regions being a first source/drain region and another of the at least two source/drain regions being a second source/drain region;

forming a masking material over the substrate, the masking material covering some portions of the substrate and having openings extending therethrough to the first and second source/drain regions; the opening extending to the first source/drain region having a threshold angle such that dopant implanted at an angle greater than the threshold angle will not reach the substrate of the first source/drain region; and implanting a dopant into the second source drain region at an angle greater than the threshold angle while the masking material is over the substrate and blocks the dopant from reaching the region.

29. The method of claim 28 wherein the substrate comprises monocrystalline silicon.

30. The method of claim 28 wherein the first and second source/drain regions are not associated with the same transistor construction as one another.

31. The method of claim 28 wherein the first source/drain region is incorporated into DRAM circuitry and wherein the second source/drain region is incorporated into circuitry peripheral to the DRAM circuitry.

* * * * *

UNITED STATES PATENT AND TRADEMARK OFFICE
CERTIFICATE OF CORRECTION

PATENT NO. : 6,645,806 B2
DATED : November 11, 2003
INVENTOR(S) : Martin Ceredig Roberts It is certified that error appears in the above-identified patent and that said Letters Patent is hereby corrected as shown below:

Column 2,
Line 27, replace "different fragment that that of FIG. 1. Specifically, FIG. 9" with
-- different fragment than that of FIG. 1. Specifically, FIG. 9 --

Column 3,
Line 44, replace "cover the second portion 42 of active region 16. 1In other" with
-- cover the second portion 42 of active region 16. In other --

Column 9,
Line 25, replace "to the third dopant is implanted an angle greater than 25°." with -- to the third dopant is implanted at an angle greater than 25°. --

Column 12,
Line 10, replace "dopant from reaching the region." with -- dopant from reaching the first source/drain region. --

Signed and Sealed this

Twenty-seventh Day of July, 2004

JON W. DUDAS
*Acting Director of the United States Patent and Trademark Office*